US006842070B2

(12) United States Patent  
Nilsson

(10) Patent No.: US 6,842,070 B2
(45) Date of Patent: Jan. 11, 2005

(54) MULTI-LEVEL CLASS-D AMPLIFIER BY MEANS OF 2 PHYSICAL LAYERS

(75) Inventor: Johan Nilsson, Lund (SE)

(73) Assignee: Dialog Semiconductor GmbH, Kirchheim-Nabern (DE)

( * ) Notice: Subject to any disclaimer, the term of this patent is extended or adjusted under 35 U.S.C. 154(b) by 25 days.

(21) Appl. No.: 10/610,046

(22) Filed: Jun. 30, 2003

(65) Prior Publication Data

US 2004/0207465 A1 Oct. 21, 2004

(30) Foreign Application Priority Data

Apr. 17, 2003  (EP) ............................................ 03368027

(51) Int. Cl.[7] ............................ H03F 3/38; H03F 3/217
(52) U.S. Cl. ...................... 330/10; 330/251; 330/207 A
(58) Field of Search ........................ 330/10, 251, 207 A

(56) References Cited

U.S. PATENT DOCUMENTS

| 4,929,947 | A | * | 5/1990 | Toyama ...................... 341/146 |
| 5,406,284 | A |   | 4/1995 | Lin et al. ..................... 341/144 |
| 5,617,058 | A |   | 4/1997 | Adrian et al. ................. 330/10 |
| 5,815,102 | A |   | 9/1998 | Melanson .................... 341/143 |
| 6,009,007 | A | * | 12/1999 | Pan ............................. 363/98 |
| 6,127,885 | A | * | 10/2000 | Colangelo .................... 330/10 |
| 6,232,833 | B1 |  | 5/2001 | Pullen ......................... 330/10 |
| 6,311,046 | B1 |  | 10/2001 | Dent ............................ 455/91 |
| 6,404,280 | B1 | * | 6/2002 | Jeng ............................ 330/10 |
| 6,466,087 | B2 | * | 10/2002 | Ruha ........................... 330/10 |

FOREIGN PATENT DOCUMENTS

| EP | 910168 A | 4/1999 | ............ H03K/7/08 |
| EP | 1227579 A2 | 7/2002 | ........... H03F/3/217 |

OTHER PUBLICATIONS

DS–02–012, U.S. Appl. No. 10/336,967, filed Jan. 6, 2003, "Linearization of a PDM Class–D Amplifier".
DS–02–013, U.S. Appl. No. 10/350,836, filed Jan. 24, 2003, "Multi Level Class–D Amplifier by Means of 2 Physical Layers".
DS–02–014, U.S. Appl. No. 10/304,784, filed Nov. 26, 2002, "Multi Level Class–D Amplifier by Means of 2 Physical Layers".
U.S. Appl. No. Publication US 2002/0105377 A1 to Masuda et al., "Digital Power Amplifier," Pub. date Aug. 8, 2002, filed Nov. 14, 2001.

* cited by examiner

*Primary Examiner*—Patricia Nguyen
(74) *Attorney, Agent, or Firm*—George O. Saile; Stephen B. Ackerman

(57) ABSTRACT

Introduce a pulse length control mechanism to generate virtual multi-level output pulses for a Class-D Amplifier, which has only 2 physical output levels. Typically a Sigma-Delta-Modulator converts the input signal into high frequency low bit rate. The disclosed invention adds functions to transform the SDM signal into pulses with equivalent multi-level time-voltage areas and adds a pulse-length-control mechanism to produce various output pulse patterns, where the summations of the positive and negative pulses, within one sampling period, result in time-voltage area values, corresponding to 3 or more digital levels. Thus the invention produces higher signal quality at lower sampling rates.

42 Claims, 4 Drawing Sheets

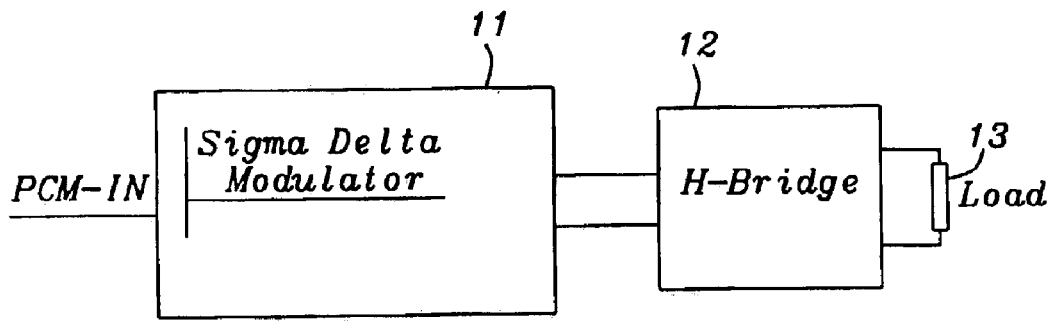
FIG. 1 - Prior Art
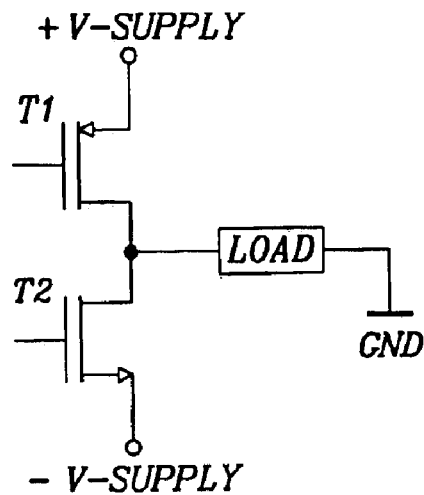
FIG. 2a - Prior Art
| +V | Transistor T1 closed, T2 open | 21 |
| --- | --- | --- |
| -V | Transistor T2 closed, T1 open | 22 |
FIG. 2b - Prior Art

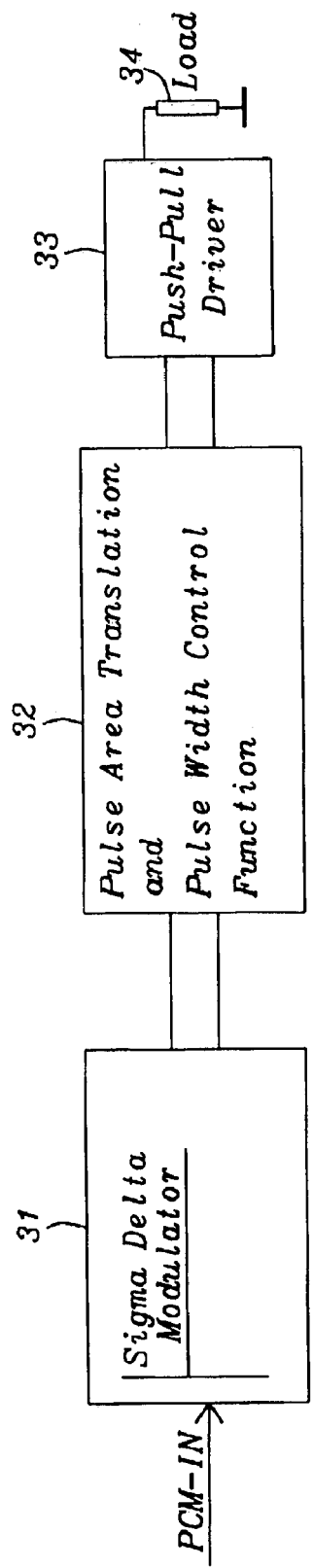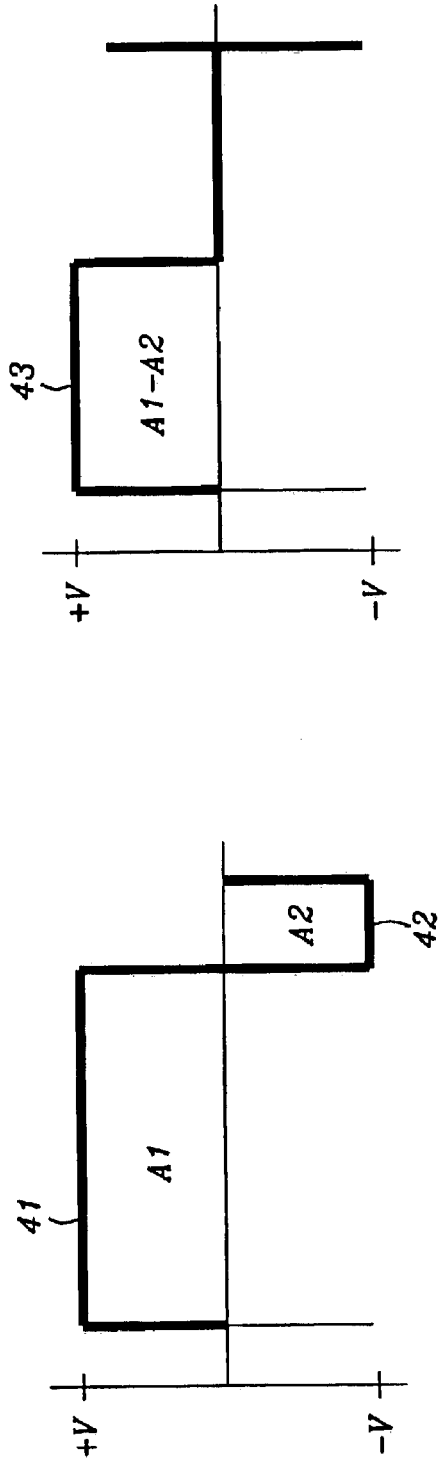

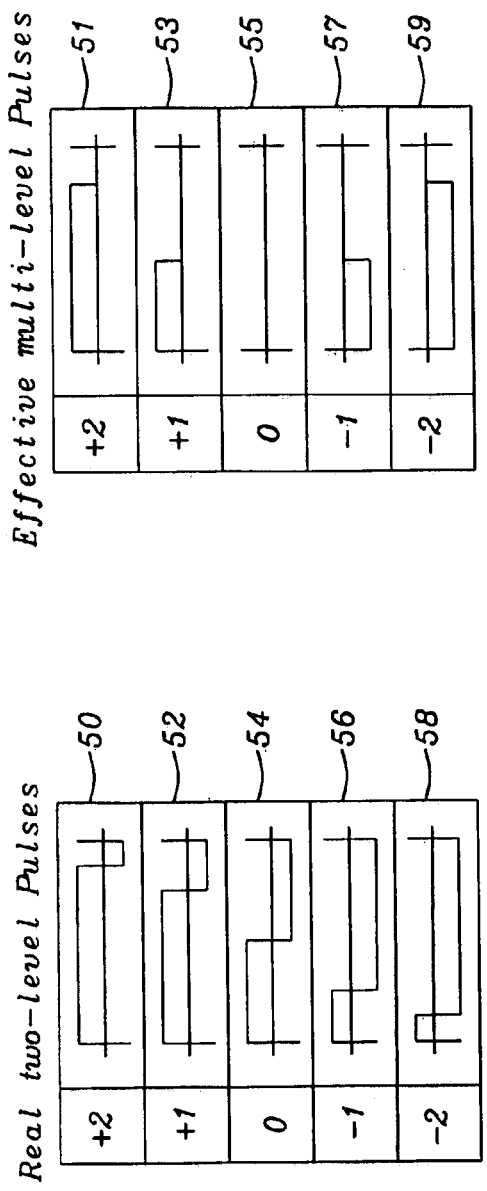
FIG. 5a
FIG. 5b
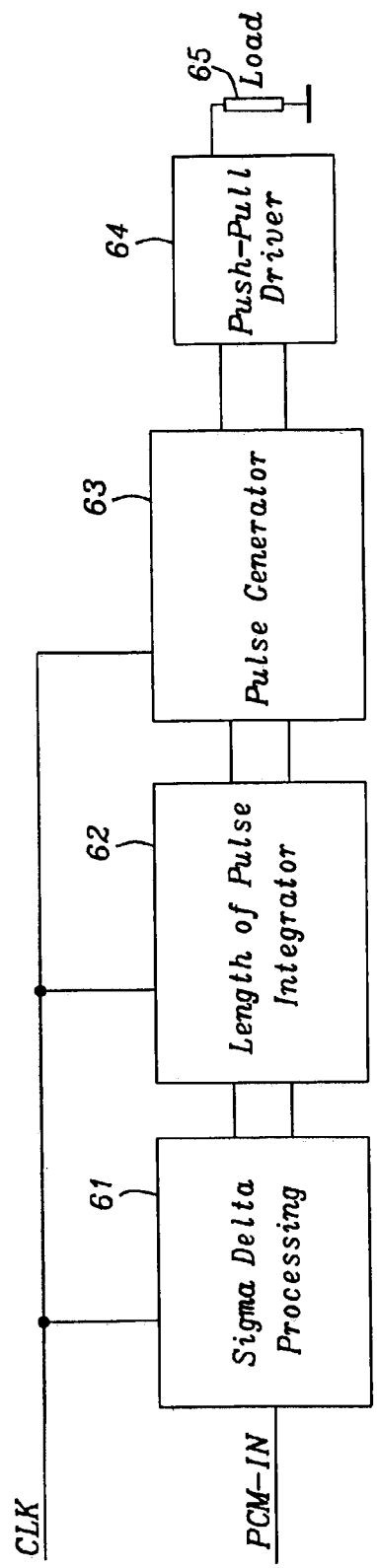
FIG. 6

US 6,842,070 B2

MULTI-LEVEL CLASS-D AMPLIFIER BY MEANS OF 2 PHYSICAL LAYERS

BACKGROUND OF THE INVENTION (1) Field of the Invention

The invention relates to a Class-D Power Amplifier, and more particularly, to a Class-D Power Amplifier having a pulse coded digital input signal and typically using a two-level amplifier stage to drive an output load, like a loudspeaker.

(2) Description of the Prior Art

Class-AB amplifiers are notoriously inefficient and Class-D amplifiers overcome this shortfall. The common concept of Class D amplifiers is to switch the output between the 2 (or 3) output levels at a very high frequency—substantially higher than the highest audible frequency, which is done by feeding high-frequency pulses to the power amplification stage. Either the pulse-width ratio of the driving signal can be varied at a constant frequency or the pulse density of the driving signal can be varied at a constant pulse width in order to make the averaged (filtered) output signal follow the (amplified) input signal very closely. Such amplifier is referred to as Pulse Width Modulated (PWM) or as Pulse Density Modulated (PDM). The output voltage at the load, after passing a low pass filter, represents the input under the assumption of a constant supply voltage.

In the case of Pulse Density Modulation, the pulse width is always constant, where the high frequency pulses can be generated by for example a Sigma Delta Modulator. The output device, a Class-D driver, in the most common case can only drive +V or −V, thus limiting the pulse generation to 2 levels. An alternative Class-D driver can drive the output to +V, −V or zero, thus providing a maximum of 3 levels.

FIG. 1 shows a schematic block diagram of a state-of-the-art PDM Class-D Amplifier. It typically comprises a Sigma Delta Modulator (11) to generate the driving signal for the Class-D power output stage, which is typically an H-Bridge (12) and the output load, often a loudspeaker (13).

FIG. 2a shows a simplified diagram of a Complementary-Pair-Driver and FIG. 2b shows the 2 output signal levels and the corresponding states of the output devices. The output level at the load LOAD is "+V" with Transistor T1 closed, T2 open (21); it is "−V" with Transistor T2 closed, T1 open (22).

U.S. Pat. No. 6,311,046 (to Dent) describes a circuit with an input signal of varying amplitude and varying phase being converted into more than two signals of constant amplitude and controlled phase. Each of the more than two signals of constant amplitude and controlled phase is then separately amplified in separate amplifiers. The separately amplified more than two signals of constant amplitude and controlled phase are then combined to produce an output signal that is an amplification of the input signal at the desired power level. When converting the input signal into more than two signals, the phase of each of the more than two signals of constant amplitude and controlled phase is controlled to produce the output signal that is an amplification of the input signal at the desired power level. According to another aspect, a signal of varying amplitude and varying phase is generated from a plurality of constant amplitude varying phase signals, the sum of which is the signal of varying amplitude and varying phase.

U.S. Pat. No. 6,232,833 (to Pullen) shows a low jitter dead time circuit which uses one RC combination to set the turn on delay for both the upper and lower MOSFETs in the half bridge. This circuit minimized jitters in the turn on delay and results in matched turn on delays for both MOSFETs in a half bridge. This minimizes noise and distortion. This circuit is further designed to be used in conjunction with shunt regulators to reject ripple from the power supplies.

SUMMARY OF THE INVENTION

In accordance with the objectives of this invention, a circuit to generate virtual multi-level output pulses for a Class-D Amplifier, where the output has only 2 physical levels (+V, −V), if for example a Complementary-Pair-Driver is used, is achieved. The disclosed invention adds circuits and methods to transform the output from the SDM (Sigma Delta Modulator) into pulses with well-defined time-voltage areas. The disclosed invention further adds circuits and methods for a pulse length control mechanism, that produces output pulse patterns, where the sum over the positive and negative portions of a pulse results in a time-voltage area, corresponding to one of multiple discrete digital levels. In this way a multi level output from the SDM is possible even though the output driver is only able to output two discrete voltage levels.

Multi-level pulse widths allow a better quality output signal. Also, using multi-level pulse widths, in contrast to just a single pulse widths, pulse-sampling rate by the same factor. In addition, better power efficiency is achieved, as well as lower EMI.

A Class-D Amplifier using PDM (Pulse Density Modulation) normally converts the input signal with a Sigma Delta Modulator (SDM) into high-frequency pulses of equal width. And a Class-D amplifier in most cases uses a Complementary-Pair Driver with its 2 switching levels (+V, −V) to drive an output load through a low-pass filter. Typical loads are a loudspeaker or a servo-motor.

The fundamental idea of the disclosed invention is to add the methods and mechanism to transform said output from the SDM into pulses with well-defined time-voltage areas.

Further, the fundamental idea is to reshape said pulses of well-defined time-voltage area values into a form, suitable for the 2 physical levels of the output driver stage. It will produce pulses, where summing of the area of the positive part and the negative part of a pulse within one sampling period results in the desired time-voltage area. (See FIG. 4a and 4b) The absolute area within one sampling period is then A1 minus A2. Said resulting time-voltage area values correspond to 3 or more digital levels. (See FIG. 5a and 5b).

To achieve this, the Digital Signal Processing Unit, also containing the input signal converter, which typically is a Sigma Delta Modulator, then transforms the SDM output signal into pulses with multiple of discrete values of well-defined time-voltage areas. It further takes said pulse width information, calculates the required pulse ratio, i.e. the length of the positive and negative part of the pulse within one sampling period.

The Length of Pulse Integration Unit then determines the point in time when to change the output phase, which defines the end of the first pulse portion and defines the start of the second pulse portion. Said "Length of Pulse Integrator" generates the pulse start and stop information, to be provided to the pulse generator. The proposed circuit may contain different techniques to determine the required pulse ratio as well as the correct point for alternating the output pulse phase.

The circuit also comprises a "Pulse Generator Unit" inserted into the signal path between said converter of PCM signals and the Class-D output power stage, which is, in the proposed invention, a Complementary Pair Driver with only 2 physical output levels (or an equivalent circuit). Said Complementary Pair Driver then drives voltage into said output load, possibly passing through some form of a low pass filter.

Further, in accordance with the objectives of this invention, a set of desired pulse area values may not only be of a priori fixed level, but may also be externally controlled.

In accordance with the objectives of this invention, a method to generate virtual multi-level output pulses for a Class-D Amplifier, where the time-voltage-area corresponds to a multiple of digital levels, is achieved. First, it converts said input signal into a signal representing multiple pulse area values. Another method defines a set of output pulse-area values, one for each step of said multiple pulse-area values. Each of these pulse-areas corresponds to a level of the multi level SDM signal. A further method determines the required pulse width information by selecting one value that corresponds to a specific pulse-area out of said set of defined output pulse-area values. Another method determines the length-ratio of positive and negative pulse portions within one sampling period. Said methods can be implemented in a "Length of Pulse Integrator" function. Said "Length of Pulse Integrator" Function takes said pulse width information, calculates the required pulse ratio, i.e. the positive and negative part of the pulse within one sampling period, and further determines the point in time when to change the output phase, which defines the end of the first pulse portion and defines the start of the second pulse portion. Said "Length of Pulse Integrator" generates the pulse start and stop information, to be provided to the pulse generator. The "Pulse Generator Unit" generates said multi-level output pulses using said pulse start and pulse stop signals and applies said power driver control pulses to said Class-D power driver. Finally said power driver feeds the output voltage to said output load, where the load includes some form of a low pass filter.

BRIEF DESCRIPTION OF THE DRAWINGS

In the accompanying drawings, forming a material part of this description, there is shown:

FIG. 1 (Prior Art) shows the schematic block diagram for a prior art solution.

FIGS. 2a and 2b (Prior Art) shows a principal circuit of a Half-Bridge (complementary pair) and its output level states.

FIG. 3 shows a fundamental block diagram for a solution, in accordance with an embodiment of this invention.

FIG. 4a shows an example of a real pulse with 2 physical levels.

FIG. 4b demonstrates the resulting effect after the positive and negative pulse have been subtracted.

FIGS. 5a and 5b visualizes the concept of multi-level pulses, first the real pulses and then the resulting effect; the example shows a 5 level system.

FIG. 6 shows the schematic block diagram for the proposed solution, in accordance with an embodiment of this invention.

DESCRIPTION OF THE PREFERRED EMBODIMENTS

Figure 7:
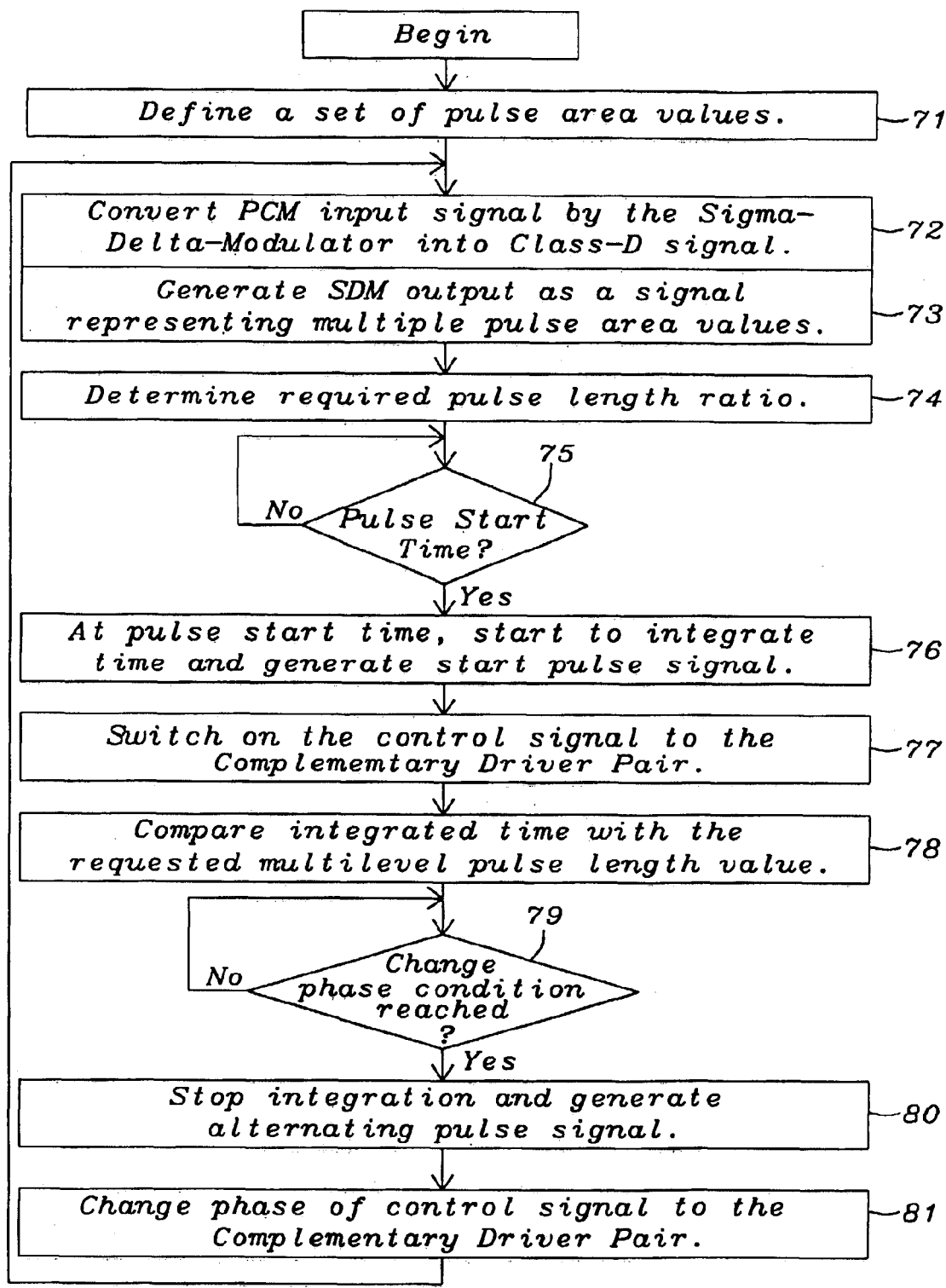
FIG. 7 shows a method to generate virtual multi-level output pulses for a Class-D Amplifier.

The objectives of this invention are to generate virtual multi-level output pulses for a Class-D Amplifier, where the output has only 2 physical levels (+V, −V). In certain environments, only a 2-level driver, like a Complementary-Pair-Driver or a Push-Pull-Driver can be implemented. The disclosed invention adds circuits and methods to transform the output from the SDM (Sigma Delta Modulator) into pulses with well-defined time-voltage areas. The disclosed invention further adds circuits and methods for a pulse length control mechanism, that produces output pulse patterns, where the sum over the positive and negative portions of a pulse results in a time-voltage area, corresponding to one of multiple discrete digital levels. In this way a multi level output from the SDM is possible even though the output driver is only able to output two discrete voltage levels. Multi-level pulse widths allow a better quality output signal. Also, using multi-level pulse widths, in contrast to just a single pulse width, allows the reduction of the pulse-sampling rate by the same factor.

A Class-D Amplifier using PDM (Pulse Density Modulation) normally converts the input signal with a Sigma Delta Modulator into high-frequency pulses low bit rate pulses. And a Class-D amplifier typically uses an H-Bridge with its 3 switching levels (+V, 0, −V) to drive an output load through a low-pass filter. Typical loads are a loudspeaker or a servo-motor.

Table FIG. 2b, which shows the states a Complementary-Pair-Driver FIG. 2a can take.

A typical pulse within a single sample period is shown in FIG. 4a. When the area of the negative pulse A2 is subtracted from the area of the positive pulse A1, as shown in FIG. 4b, it results in a signal with the area A1−A2. As an example a 5-level system is shown: the real 2-level pulses in FIG. 5a and their resulting multilevel pulses in FIG. 5b. It visualizes the real 2-level pulses and their corresponding virtual multilevel pulses for said 5 levels: "+2" (50) (51), for "+1" (52) (53), for "0" (54) (55), for "−1" (56) (57) and for "−2" (58) (59).

The schematic block diagram in FIG. 3 gives a coarse overview on the concept of adding circuits and methods for a pulse transformation and a pulse length control mechanism, that produces output pulse patterns corresponding to 3 or more discrete digital levels on a system with only 2 physical output levels.

The fundamental idea is to generate pulses with a variety of well-defined time-voltage areas and then to reshape said pulses to make them suitable for the 2 physical levels of the output driver stage. It will produce pulses, where summing of the area of the positive and the negative pulse within one sampling period results in the desired time-voltage area. (See FIG. 4a and 4b) The absolute area within one sampling period is then A1 minus A2. Said time-voltage area values, corresponds to 3 or more digital levels. (See FIG. 5a and 5b).

FIG. 6 shows a schematic block diagram as disclosed in this invention. To achieve the objectives, the processing unit for the input signal converter (61), typically comprising a Sigma Delta Modulator, converts the input signal into high-frequency low bit rate signal. Then it transforms the SDM output signal into pulses with multiple of discrete values of well-defined time-voltage areas A "Length of Pulse Integrator" Function (63) takes said pulse width signal, calculates the required pulse ratio, i.e. the positive and negative part of the pulse within one sampling period, and further determines the point in time when to change the output phase, which defines the end of the first pulse portion and defines the start of the second pulse portion. Said "Length of Pulse Integrator" generates the pulse start and stop information, to be provided to the pulse generator. The proposed circuit may contain different techniques to determine the required pulse ratio as well as the correct point for alternating the output pulse phase.

The circuit also comprises a "Pulse Generator Unit" (64) inserted into the signal path and driving the Class-D output power stage, which is, as said before, a Complementary-Pair-Driver or a Push-Pull-Driver or equivalent (65). Said output driver then drives voltage into said output load possibly through some form of a low pass filter.

The method to achieve the objectives of this invention is illustrated in FIG. 7. First, in (71), a set of desired pulse area values is defined. In step (72) the input signal is converted by the Sigma-Delta-Modulator into high frequency low bit rate signal. In step (73) it generates a signal representing multiple pulse area values. Another step (74) determines the required pulse width information by selecting one value that corresponds to a specific pulse-area out of said set of defined output pulse-area values and then determines the length-ratio of positive and negative pulse portions within one sampling period. Now at pulse start time (75), said Length of Pulse Integrator starts to integrate the time (76). At the same time the Pulse-Generator switches on the control signal to the Complementary Pair Driver (77). Said Length of Pulse Integrator compares said integrated time value with selected pulse area reference and determines the point in time when to change the output phase, which defines the end of the first pulse portion and defines the start of the second pulse portion (78). Once the Stop condition is reached (79), the Length of Pulse Integrator stops integrating and generates the pulse stop signal (80) and therefore the control signal to the Complementary Pair-Driver is alternated again (81).

While the invention has been particularly shown and described with reference to the preferred embodiments thereof, it will be understood by those skilled in the art that various changes in form and details may be made without departing from the spirit and scope of the invention.

What is claimed is:

1. A circuit to generate virtual multi-level output pulses for a Class-D Amplifier with only 2 physical levels, where the resulting time-voltage-area corresponds to a multiple of digital levels, comprising:

means to convert the input signal into a PDM (Pulse Density Modulated) signal;

means to generate the output of said PDM (Pulse Density Modulated) as a signal, representing the desired multiple of pulse areas values;

means to determine the required length-ratio of positive and negative pulse portions within one sampling period, where said pulse length ratio represents said multiple pulse-area values;

means to define a set of output pulse-area values, one for each step of said multiple pulse-area values;

means to control the time of pulse phase changes within one sampling period;

a pulse generator providing the virtual multi-level output pulses to a power driver, using said pulse length controlled signal;

means for a Class-D power driver to drive voltage into an output load, controlled by said power driver pulses, typically a Complementary-Pair-Driver or an equivalent circuit; and means for an output load as the amplifier's output target.

2. The circuit of claim 1 wherein said input signal is an analog signal.

3. The circuit of claim 1 wherein said input signal is PCM (Pulse Code Modulated), i.e. a digital signal with low sampling rate and high bit resolution.

4. The circuit of claim 1 wherein said means to convert the input signal into a PDM (Pulse Density Modulated) signal comprises a Sigma Delta Modulator.

5. The circuit of claim 1 wherein said means to generate the output of said PDM (Pulse Density Modulated) as a signal, representing the desired multiple of pulse areas values is implemented in a digital signal processor as an integrated part together with the Sigma Delta Modulator.

6. The circuit of claim 1 wherein said means to determine said pulse length ratio can provide at least 3 values.

7. The circuit of claim 1 wherein said means to control said pulse length ratio uses a system provided clock signal, to define the start of the first portion of the driving pulse.

8. The circuit of claim 1 wherein said means to control said pulse length ratio produces a change-phase-signal between clock pulses, defining the end of the first pulse portion and defining the start of the second pulse portion.

9. The circuit of claim 8 wherein said means to determine the change-phase-time is a time integrating function.

10. The circuit of claim 9 where said time integrating function to determine the change-phase-time is implemented within a "Length of Pulse Integrator" unit.

11. The circuit of claim 1 wherein said means to define a set of output pulse-area values assumes a set of fixed and a priori known magnitudes.

12. The circuit of claim 11 wherein said set of a priori known magnitudes, representing said set of output pulse-area values, can be varied by means of an external control definition.

13. The circuit of claim 1 wherein said means for a Class-D power driver is a Complementary Driver Pair (Half-Bridge).

14. The circuit of claim 1 wherein said means to convert said PDM (Pulse Density Modulated) signal is implemented as an integrated digital logic function.

15. The circuit of claim 1 wherein said means to convert said PDM (Pulse Density Modulated) signal is implemented as a calculating algorithm in a digital signal processor.

16. The circuit of claim 1 wherein said means to control said pulse length ratio, representing said multiple pulse-area values, is implemented as an integrated digital logic function.

17. The circuit of claim 1 wherein said means to control said pulse length ratio, representing said multiple pulse-area values is implemented as a calculating algorithm in a digital signal processor.

18. The circuit of claim 9 wherein said time integrating function to determine said change-phase-time, is implemented as an analog integrated function.

19. The circuit of claim 9 wherein said time integrating function to determine said change-phase-time, is implemented as an integrated digital logic function.

20. The circuit of claim 9 wherein said time integrating function to determine said change-phase-time, is implemented as a calculating algorithm in a digital signal processor.

21. The circuit of claim 1 wherein said pulse generator providing said virtual multi-level output pulses for said power driver is implemented as an integrated digital logic function.

22. The circuit of claim 1 wherein said pulse generator providing said virtual multi-level output pulses for said power driver is implemented as a calculating algorithm in a digital signal processor.

23. A method to generate virtual multi-level output pulses for a Class-D Amplifier with only 2 physical levels, where the resulting time-voltage-area corresponds to a multiple of digital levels, comprising:

providing means to convert the input signal into ideal PDM (Pulse Density Modulated) control pulses, means to generate the output of said PDM (Pulse Density Modulated) converter as a signal, representing the desired multiple of values of pulse areas, means to define a set of output pulse-area values, means to determine the required length-ratio of positive and negative pulse portions within a sampling period, means to control the time of pulse phase changes, a pulse generator providing the virtual multi-level output pulses to a power driver, means for a Class-D power driver to drive voltage into an output load and means for an output load;

converting said input signal into ideal PDM (Pulse Density Modulated) control pulses;

generating the output of said PDM signal converter as a multiple of values, representing the desired pulse areas;

determining said length-ratio of positive and negative pulse portions within one sampling period, where said pulse length ratio represents said multiple pulse-area values;

defining a set of output pulse-area values, one for each step of said multiple pulse-area values;

controlling the time to change the pulse phase within a sampling period, based on the desired pulse length ratio, with an appropriate time control mechanism;

generating said virtual multi-level output pulses under control of the signal, which changes said pulse phase;

applying said virtual multi-level output pulses to said Class-D power driver; and driving said power driver's output voltage to the output load (typically a loudspeaker).

24. The method of claim 23 wherein converting said input signal into ideal PDM control pulses is done by a processing unit containing a Sigma Delta Modulator.

25. The method of claim 23 wherein converting said input signal into ideal PDM control pulses and generating the output of said PDM signal as a signal, representing the desired multiple of values of pulse areas, is performed within a combined function.

26. The method of claim 23 wherein controlling said pulse length ratio uses 3 or more values.

27. The method of claim 23 wherein controlling said time to change the pulse phases, starts one phase of said pulses at a system provided clock signal, typically the sampling clock of the PDM signal.

28. The method of claim 23 wherein controlling said time to change the pulse phases, alternates the pulse phase at a time primarily depending on the required pulse length ratio, and in direct relation to said system provided clock signal, typically the sampling clock of the PDM signal.

29. The method of claim 28 wherein determining the time to alternate said pulse phase is performed by integrating the time and comparing the result with a value derived from said pulse length ratio.

30. The method of claim 29 wherein determining the time to alternate said pulse phase by integrating the time and comparing the result with a value derived from said pulse length ratio, is done in a "Length of Pulse Integrator" function.

31. The method of claim 23 wherein defining the set of output pulse area references assumes a set of fixed and a priori known magnitudes.

32. The method of claim 23 wherein an external control definition can vary said set of a priori known magnitudes, which represent said set of output pulse-area values.

33. The method of claim 23 wherein a Complementary Driver Pair (Half-Bridge) is used for driving voltage to said output load.

34. The method of claim 23 wherein converting said input signal into ideal PDM power driver control pulses is implemented by an integrated digital logic function.

35. The method of claim 23 wherein converting said input signal into ideal PDM power driver control pulses is implemented by a calculating algorithm in a digital signal processor.

36. The method of claim 23 wherein controlling said pulse length ratio, representing said multiple pulse-area values, is implemented by an integrated digital logic function.

37. The method of claim 23 wherein controlling said pulse length ratio, representing said multiple pulse-area values is implemented by a calculating algorithm in a digital signal processor.

38. The method of claim 23 wherein the time integrating function, determining the time to change the pulse phase within a sampling period is partially implemented by an integrated analog function.

39. The method of claim 23 wherein controlling the time to change the pulse phase within a sampling period, based on the desired pulse length ratio is implemented by an integrated digital logic function.

40. The method of claim 23 wherein controlling the time to change the pulse phase within a sampling period, based on the desired pulse length ratio is implemented by a calculating algorithm in a digital signal processor.

41. The method of claim 23 wherein generating said multi-level power driver control pulses is performed in an integrated digital logic function.

42. The method of claim 23 wherein generating said multi-level power driver control pulses is performed in a calculating algorithm in a digital signal processor.

* * * * *